United States Patent [19]
Krenik

[11] Patent Number: 4,839,633
[45] Date of Patent: Jun. 13, 1989

[54] ASYMMETRIC VOLTAGE MONITOR FOR SERIES SUPPLIES

[75] Inventor: William R. Krenik, Dallas, Tex.

[73] Assignee: Texas Instruments Incorporated, Dallas, Tex.

[21] Appl. No.: 65,979

[22] Filed: Jun. 24, 1987

[51] Int. Cl.⁴ .............................................. G08B 21/00
[52] U.S. Cl. .................................... 340/661; 340/636; 324/434; 320/48; 338/137
[58] Field of Search ............... 340/636, 660, 661, 662, 340/663, 664; 324/426, 433, 434, 436, 435, 427; 320/48; 307/43, 48, 49, 50, 54, 61, 63, 350, 354, 359, 335; 361/78, 86; 338/87, 118, 128, 137; 357/51

[56] References Cited
U.S. PATENT DOCUMENTS

| | | |
|---|---|---|
| 3,872,457 | 3/1975 | Ray et al. ............... 340/636 |
| 3,942,104 | 3/1976 | Byrne ...................... 324/434 |
| 4,012,710 | 3/1977 | Ward et al. ............. 338/137 |
| 4,134,060 | 1/1979 | Feldman ................. 324/434 |
| 4,181,878 | 1/1980 | Murari et al. ........... 357/51 |
| 4,424,491 | 1/1984 | Bobbett et al. ......... 324/434 |
| 4,463,271 | 7/1984 | Gill, Jr. .................... 307/350 |

Primary Examiner—Joseph A. Orsino
Assistant Examiner—Jill D. Jackson
Attorney, Agent, or Firm—Thomas R. FitzGerald; Leo N. Heiting; Melvin Sharp

[57] ABSTRACT

Disclosed is a supply voltage monitor for detecting the asymmetric decay of one voltage source ($V_{dd}$) with respect to another voltage source ($V_{ss}$). The monitor circuit (24) includes a resistive voltage divider (26) having a plurality of voltage tap positions (32,35,38). A sensor transistor (40) monitors the voltage between a common connection (16) connecting the voltage sources and the voltage at a desired tap position (38) of the divider network (26). On detecting an imbalance between the voltage sources ($V_{dd}$, $V_{ss}$), the sensor transistor (40) drives a current mirror circuit (42). The current mirror circuit (42) defines an output (50) of the monitor circuit (24), together with a reference transistor (48) biased by a voltage of the divider network (26).

39 Claims, 2 Drawing Sheets

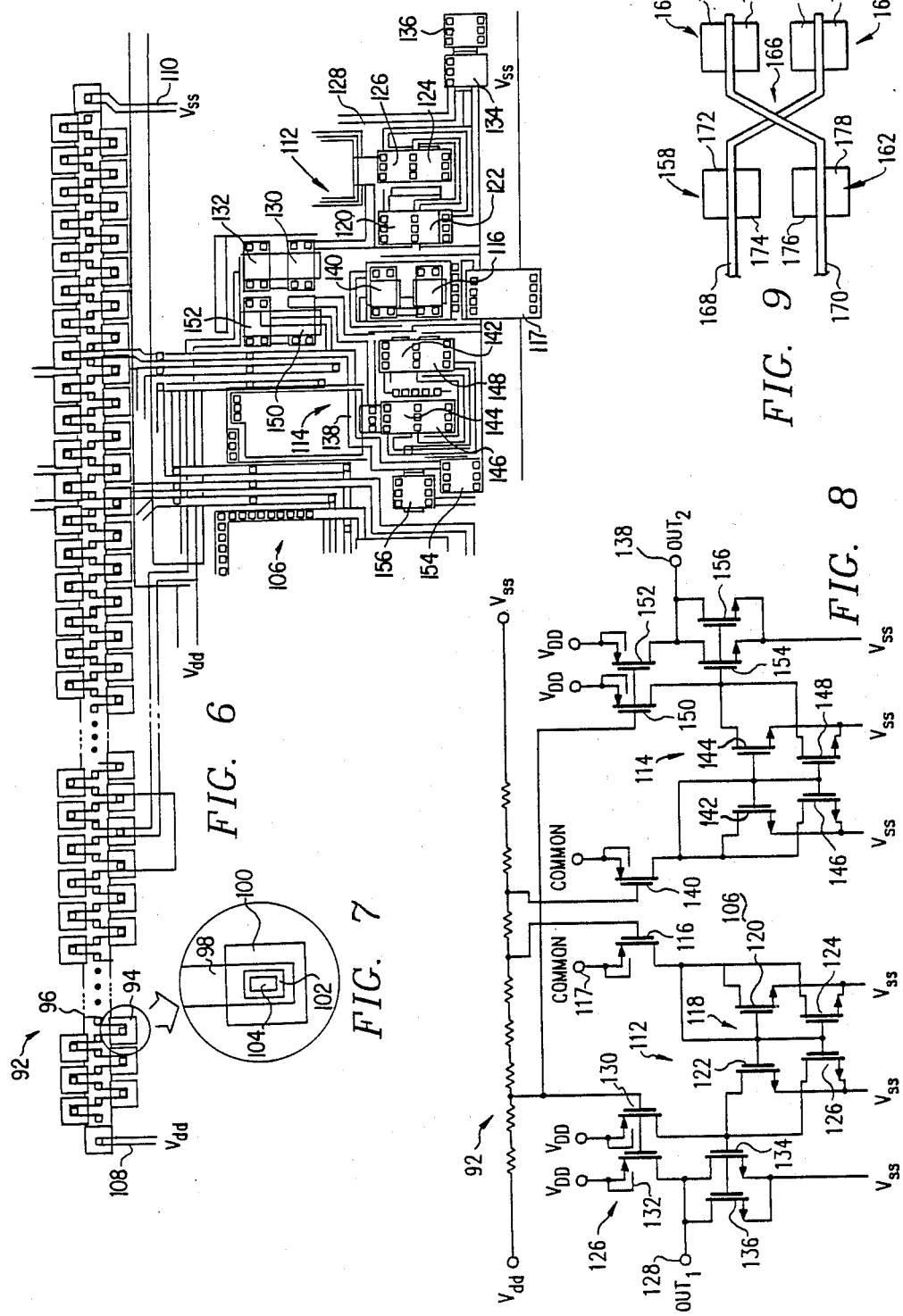

ASYMMETRIC VOLTAGE MONITOR FOR SERIES SUPPLIES

TECHNICAL FIELD OF THE INVENTION

The present invention relates in general to apparatus and methods for monitoring voltage, and more particularly relates to apparatus and methods for monitoring the asymmetric decay of series connected battery supplies.

BACKGROUND OF THE INVENTION

Great strides have been made in the battery industry for improving the reliability and lifetime of DC voltage supplies Alkaline and lithium batteries can now provide useful lifetimes much longer than dry cell batteries heretofore known.

Because of the advances in the battery field, electrical apparatus has become more dependent on batteries for supplying the voltage thereto While batteries present an economical and reliable source of voltage for many types of electrical apparatus and circuits, one shortcoming is that the life of a battery is difficult to determine It is expedient in some situations to simply operate the electrical apparatus until the batteries are dead, while in other situations the batteries may be changed or recharged on a regular schedule to assure reliable and continued operation. While this last approach is very effective in terms of reliability, the batteries are generally replaced while there is yet some useful life available.

Some applications, especially in the medical field, require the reliable operation of battery-powered circuits, and thus are monitored accordingly. Other applications, such as watches, cameras, etc., preferably include monitor circuits for providing the user with a visual indication of a low voltage condition. U.S. Pat. No. 4,463,271 is exemplary of such a battery monitor circuit. The circuit of the noted patent includes a number of comparators, a reference voltage and a current source. The number of circuit components thus required is considerable, even for a single supply monitor, thus making it less attractive for integration with other circuits.

It can be seen from the foregoing that a need exists for a simple uncomplicated voltage monitor circuit requiring few components, and thus being easily integrated with other circuits An associated need exists for a voltage monitor for detecting when the outputs of a dual series supply circuit decays asymmetrically. Yet another need exists for a technique to enable the adjustment of the monitor point during post-fabrication processing of the integrated circuit chip.

SUMMARY OF THE INVENTION

In accordance with the present invention, the voltage monitor method and apparatus reduces or substantially eliminates the disadvantages and the shortcomings associated with the prior art techniques. The voltage monitor of the invention is connected between dual voltage sources, such as battery supplies, to give an indication when the voltage of one supply decays asymmetrically with respect to the voltage of the other supply. An important technical advantage of the monitor circuit of the invention is that no precision references are required and no complex differential comparators are required, as is characteristic with known voltage monitors. Another important technical advantage presented by the invention is that very few components are required for ease of integration with CMOS circuits, and the circuit performance thereof is independent of the silicon fabrication processing steps and independent of temperature considerations. Hence, a technical advantage of the invention is that such monitor circuits can be produced with highly predictable performance characteristics. An additional technical advantage offered by the invention is the provision of a choice of interconnections made in the final metallization steps of the fabrication process for setting a trip point for monitoring purposes, and to determine which one of the voltage sources is to be monitored with regard to the other voltage source to provide an output indication of asymmetry.

The foregoing and other technical advantages are realized by the invention which includes a voltage divider connected between the voltage sources, with a number of taps for providing a continuum of selectable voltages between the magnitudes of the respective supply voltages As the magnitude of voltage of one of the supplies changes with respect to the other, the voltages along the divider also change. If both supply voltages are of equal magnitude, and decay symmetrically, the voltage at the midpoint of the divider does not change. A sensor transistor is responsive to the change in the voltage existing between a common point connecting the two supply voltages, and a selected point of the voltage divider. A transistor pair forming a current mirror is effective to translate an indication of an asymmetric power supply condition, as sensed by the sensor transistor, into an output digital indication. An output of the monitor circuit of the invention comprises a two-transistor push-pull type of output, one transistor being a reference transistor and the other transistor being defined by a current mirror transistor. A monitor circuit constructed with NMOS and PMOS transistors can provide a small area low power circuit easily integrated with other CMOS circuits.

A pair of such monitor circuits can be utilized, each connected to different points of the voltage divider for yielding an early indication of battery failure, and another indication which can be employed to shut down circuits powered by the batteries when the voltage magnitude thereof falls below a prescribed value.

Further enhancements of the invention include the cascoding of the transistors to increase the output impedance of the monitor circuit as well as to provide a higher overall gain. An output inverter can be added to the monitor circuit to increase overall gain. Further, a precision inverter can be realized by cross coupling pairs of transistors and fabricating the same in a predefined orientation in a silicon substrate to reduce first order geometry effects, thus improving the accuracy and predictability of operational characteristics. An overall technical advantage presented by the invention is that a noncomplicated, cost-effective, high precision and stable monitor circuit is provided.

BRIEF DESCRIPTION OF THE DRAWINGS

Further features and advantages will become apparent from the following and more particular description of the preferred embodiment of the invention, as illustrated in the accompanying drawings in which like reference characters generally refer to the same parts, circuits or devices throughout the views, and in which:

FIG. 6 is top layout view of a portion of a silicon integrated circuit, illustrating the layout of the monitor circuit of the invention;

FIG. 7 is an enlarged view of a portion of the integrated voltage divider embodied in the monitor circuit;

FIG. 8 is an electrical schematic circuit drawing depicted in the layout view of FIG. 6; and FIG. 9 is a top layout illustration of cross-coupled transistor pairs utilized in the preferred embodiment of the invention.

DETAILED DESCRIPTION OF THE INVENTION

Figure 1:
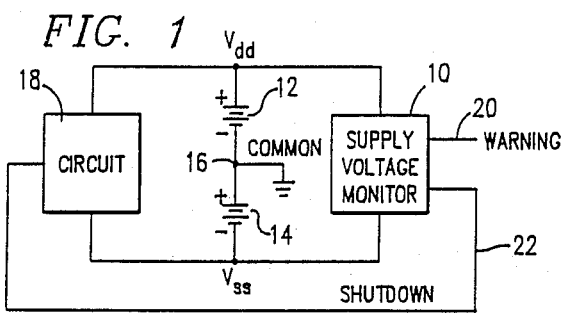
FIG. 1 is a simplified diagram of an environment in which the invention may be advantageously practiced.

FIG. 1 illustrates a typical application with which the present invention has particular utility. Illustrated is the supply voltage monitor 10 of the invention for monitoring a pair of batteries 12 and 14 providing respective supply voltages $V_{dd}$ and $V_{ss}$. The batteries are connected together by a common connection 16 which, in the illustrated embodiment, is connected to ground, but is not required to be so connected. The negative terminal of battery 12 is connected to the positive terminal of battery 14, via the common connection 16. Such a type of battery connection is termed a "split supply". The additive voltage of batteries 12 and 14 is then applied to an electrical circuit 18 for providing a supply voltage thereto While it is not necessary, the voltages of the battery supplies 12 and 14 may be of equal magnitudes. Many circuits, such as operational amplifiers, digital-to-analog converters, etc., require supply voltages of equal and opposite polarities. In addition, many circuits require supply voltage magnitudes as low as 1-3 volts, thereby providing an overall supply of two to six volts. Calculators and watches are illustrative of products requiring such supplies.

The supply voltage monitor 10 is connected across the batteries 12 and 14 for monitoring the voltage output of such batteries, and more particularly for sensing when the battery voltages are not substantially equal, thereby indicating that one battery is decaying faster than the other. The asymmetric decay of batteries indicates that the life of such batteries is about to expire. According to one embodiment of the invention, the supply voltage monitor 10 can provide an early warning output 20 indicating an initial asymmetry between the voltage magnitudes of the battery supplies 12 and 14. On sensing a further asymmetric operation of the battery supplies 12 and 14, the supply voltage monitor 10 provides a shutdown output 22 connected to the circuit 18 to inhibit the operation of such circuit 18. In this manner, the low voltage condition of one or both batteries 12 and 14 will not cause erroneous operation of the powered circuit 18.

As will be more fully appreciated from the following description of the invention, it may be realized that the monitor circuit need not operate specially with a battery type of supply, but can operate with electrical supplies as well, or even monitor circuit voltages which are characterized as internal circuit voltages Hence, the illustrations utilized herein are purposes of example, and are thus not to be construed as limiting the scope or application of the invention.

Figure 2:
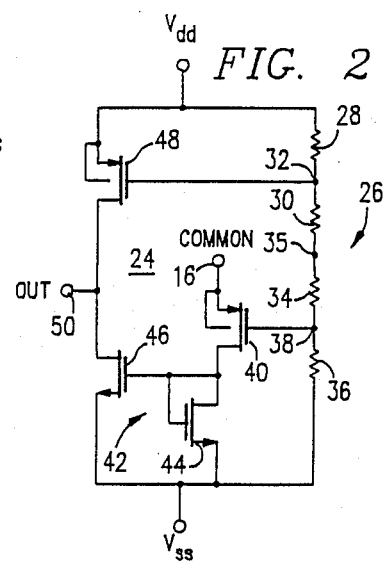
FIG. 2 is an electrical schematic drawing of the monitor circuit in accordance with the preferred embodiment of the invention.

FIG. 2 illustrates in electrical schematic form one embodiment of a monitor circuit 24 embodying the principles and concepts of the invention. The monitor circuit 24 is connected between a positive supply voltage $V_{dd}$ and a negative supply voltage $V_{ss}$. Also connected between the supply voltages $V_{dd}$ and $V_{ss}$ is a voltage divider network 26 including series-connected resistors 28 and 30 joined at node 32, resistors 30 and 34 joined at node 35, and resistors 34 and 36 joined at node 38. In the preferred form of the invention, each resistor is of equal value and chosen so that the overall current through the divider network 26 is low, thereby minimizing the consumption of power. The construction of the divider network will be described in more detail below.

A sensor transistor 40, of a P-channel type, is connected so as to be responsive to a threshold voltage existing between the supply common connection 16 and a selected point 38 of the divider network 26. The source terminal of transistor 40 is connected to the common connection 16, while the gate thereof is connected to divider network junction 38. Internally, the source of sensor transistor 40 is connected to the backgate region of the silicon semiconductor chip. The drain, or output, of the sensor transistor 40 is connected to a two-transistor current mirror arrangement 42 defined by N-channel transistor 44 and N-channel transistor 46. The gate and drain of transistor 44 are connected in common to both the gate of transistor 46 and the drain of sensor transistor 40. The source terminals of current mirror transistors 44 and 46 are connected together to the $V_{ss}$ supply.

The current mirror 42 functions to translate the output of the sensor transistor 40 into a digital output of the monitor circuit 24. Since both mirror transistors 44 and 46 are identically constructed, the current through transistor 44 is mirrored in a 1:1 ratio with current in transistor 46, and thus in the output of the monitor 24. Importantly, the use of the current mirror improves the precision of the trip point of the sensing transistor 40. In practice a trip point precision of better than one-tenth of a percent has been achieved. The output of the monitor circuit 24 comprises a P-channel reference transistor 48 having a gate terminal thereof connected to a divider network junction 32, and with source and drain terminals connected respectively to the $V_{dd}$ supply voltage and the drain of current mirror transistor 46. Like sensor transistor 40, the reference transistor 48 has its source tied to the backgate semiconductor region. This improves the joint performance of the devices Also, because the sensor transistor 40 and the reference transistor 48 both have gate-source voltages referenced to the supplies and the voltage divider 26, any change in temperature affects both such transistors in like manner, the result of which is offsetting and thus does not affect the electrical operation of the monitor 24. The junction of the connected transistors 46 and 48 provides a high impedance output 50 of the supply voltage monitor circuit 24.

The resistor divider 26 provides a number of points which may be tapped to obtain a voltage level between the $V_{dd}$ and $V_{ss}$ supply voltages. Any number of resistors may be utilized to form the voltage divider 26. A large number of divider points, and thus voltages, can thus be obtained by employing a large number of resistors to form the divider 26. It should be realized that the voltage divider 26 need not incorporate a plurality of discrete resistor elements, but rather can be constructed utilizing the well known silicon fabrication technology, employing a resistive polycrystalline silicon (polysilicon) strip or line.

The voltage divider point 35 defines a midpoint of the divider, wherein, if the supply voltages $V_{dd}$ and $V_{ss}$ decline symmetrically, the voltage at the divider midpoint 35 will not change with respect to the common connection 16. Also, voltage tap positions located near the lower end of the divider 26 provide voltage sensing points which change to a greater extent with changes in the supply voltages, then do other points located near the top of the voltage divider 26 Thus, connections can be made to various taps of the voltage divider 26 to sense small voltage changes which are proportional to larger changes in the voltage $V_{ss}$. The resistances forming the upper part of the voltage divider 26 function in like manner with regard to changes in the supply voltage $V_{dd}$.

The supply voltage monitor of FIG. 2 is constructed to sense when the positive supply voltage $V_{dd}$ declines in magnitude before that of the negative supply voltage $V_{ss}$. Because of the connection of the sensor transistor 40 to the divider network node 38, such monitor is responsive to voltage differences between $V_{dd}$ and $V_{ss}$ of a predefined magnitude. For example, the monitor 24 may not respond to $V_{dd}/V_{ss}$ differences of less than 100 millivolts, but will provide an output when the absolute value of $V_{dd}$ falls more than 100 millivolts below the absolute value of $V_{ss}$. When the sensor transistor 40 is connected further down on the divider network 26, the difference between $V_{dd}$ and $V_{ss}$ decreases before an output indication is provided.

During operation of the supply voltage monitor 24, when the battery supplies 12 and 14 are fully charged and are of equal but opposite polarity, the midpoint connection 35 of the voltage divider 26 is characterized by a voltage substantially equal to that at the common node 16. Also, the voltage divider 26 is constructed so that the voltage existing across resistance 34 is less than the gate-source threshold voltage of the sensor transistor 40. Thus, under normal operating conditions, the sensing transistor 40 is not conducting. Because transistor 40 drives the current mirror 42, with transistor 40 in a cutoff state, the current mirror transistors 44 and 46 are also nonconducting As noted, mirror transistor 46 and reference transistor 48 comprise the push-pull structure of the high impedance output of the monitor 24.

The voltage divider 26 is constructed so that the voltage across divider resistance 28 is greater than the threshold voltage of output reference transistor 48, whereby transistor 48 is normally in a conductive state Importantly, the bias voltage across divider resistor 28 establishes a current through reference transistor 48, which current is provided to the monitor output 50. As the voltage of supply $V_{dd}$ decreases, the current through the reference transistor 48 also decreases Because reference transistor 48 is normally conductive and mirror transistor 46 is nonconductive, the voltage monitor output 50 will be at a logic high state. Such high state is an indication that the supply voltage $V_{dd}$ is greater than $V_{ss}$ with respect to the absolute magnitudes thereof.

In the event that the supply voltage $V_{ss}$ decays in absolute magnitude lower than that of the $V_{dd}$ supply voltage, such event will not affect the operation of the circuit of FIG. 2 as the voltage at sensing node 38 becomes more positive, thereby biasing transistor 40 further into cutoff. However, when the supply voltage $V_{dd}$ begins to drift or decline below that of $V_{ss}$, two actions occur. First, and as noted above, the current through the reference transistor 48 begins to decrease. Secondly, the voltage at sensing node 38 will begin to change in the negative direction. A point will be reached at which the voltage at the sensing node 38 becomes sufficiently negative as to forward bias the sensor transistor 40 into conduction. Such a voltage, defined as a trip voltage, and the resolution thereof, can be established by connecting the sensing transistor 40 to a selected node of the divider 26. By constructing the divider 26 with varying numbers of series resistances, a variety of trip points can be made available.

It should be noted that even though one or both of the supply voltages $V_{dd}$ and $V_{ss}$ change, the voltage at the commonly connected node 16 does not change. Hence, changes in the supply voltages $V_{dd}$ and $V_{ss}$ are reflected in changes in voltages at the various nodes of the divider 26 and are capable of being sensed by the proper connection of the sensing transistor 40 thereto.

Continuing with the example, when sensor transistor 40 is triggered into conduction by the reduced magnitude by the supply voltage $V_{dd}$, such transistor provides a drive to the current mirror 42, thereby driving mirror transistors 44 and 46 into conduction. During the transition during which the output 50 is changing from a logic high state to a logic low state, the current in reference transistor 48 is decreasing while the current in mirror transistor 46 is increasing. With the high output impedance characteristics of the monitor 24, the current between the reference transistor 48 and the mirror transistor 46 is readily translated into a logic voltage state. Stated in another way, when the output current is primarily due to the reference transistor 48, a logic high will result, but when the current of mirror transistor 46 produces a current which has a subtractive effect on that of reference transistor 48, a logic low will result. The logic low state provides an indication of asymmetric operation of the supply voltages $V_{dd}$ and $V_{ss}$, and in the particular example, the indication that $V_{dd}$ has dropped by a predefined amount below the absolute magnitude of $V_{ss}$.

The temperature stability of the monitor circuit 24 can be appreciated by noting that temperature has the same effect on both transistors 46 and 48. For example, as temperature increases, the drain current of both transistors 46 and 48 increases. Because of the subtractive effect the current of transistor 46 has on that of transistor 48, the overall current at output 50 is thus independent of temperature. For example, if at a particular state of the monitor output 50 transistor 48 produced ten microamp and transistor 46 produced a negative two microamp, there would be provided a net eight microamps. Assuming an increase in temperature caused transistor 48 to produce twelve microamp while transistor 46 produced a negative four microamp, the net output would still be eight microamps.

If it were desired to construct the supply voltage monitor 24 to be responsive to large differences between the supply voltages, then the sensor transistor 40 would be connected to the voltage divider near or at the midpoint node 35. As noted above, the voltage at node 35 is substantially identical to that at the commonly connected node 16 when the supply voltages $V_{dd}$ and $V_{ss}$ are substantially identical in absolute magnitude. Thus, the supply voltage $V_{dd}$ must change substantially before the threshold voltage of the sensor transistor 40 is reached, thereby tripping the monitor so that the output 50 changes state.

It can be appreciated from the foregoing that the voltage monitor 24 is universal in operation, in that such circuit need not be specifically designed for particular magnitudes of the voltages $V_{dd}$ and $V_{ss}$. Also when the voltage monitor 24 is utilized for monitoring small supply voltages, such as ±2 volts, the sensing transistor 40 will trigger in response to small voltage changes at the sensing node 38. When utilized in connection with supply voltages of larger magnitudes, such as ±15 volts, the sensing transistor will be triggered in response to corresponding larger changes in the voltage at sensing node 38. This self-adjusting feature is highly advantageous, in that larger voltage changes may be tolerated when using corresponding larger supply voltages, whereas changes in smaller supply voltages are more critical, and thus must be sensed with a higher resolution.

Figure 3:
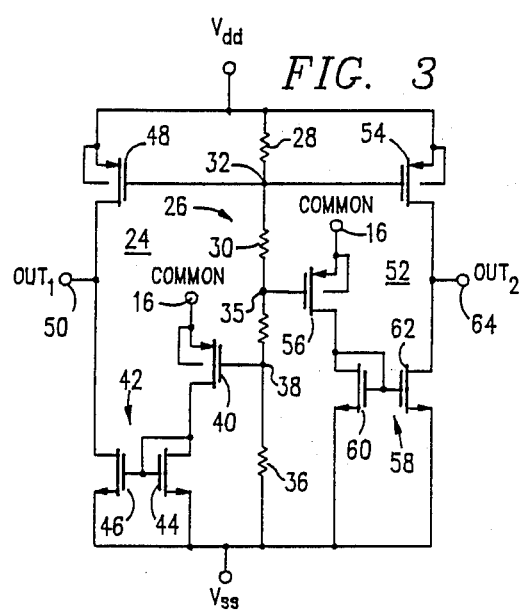
FIG. 3 is an electrical schematic illustration of a pair of monitor circuits connected together to provide multiple indications of battery operations.

FIG. 3 illustrates another embodiment of the supply voltage monitor of the invention, incorporating the monitor 24 of FIG. 2, and further incorporating an additional monitor 52 connected to the voltage divider 26 at a sensing node different from that to which the monitor 24 is connected. Essentially, voltage monitor 52 is a mirror image of monitor 24, with an output P-channel transistor 54 corresponding to output transistor 48, a sensing transistor 56 corresponding to sensing transistor 40, and a current mirror 58 corresponding to current mirror 42 More particularly, current mirror transistors 60 and 62 of monitor 52 correspond respectively to mirror transistors 44 and 46 of monitor 24.

Voltage monitor 52 supplies an output 64 providing a digital signal based upon the voltage sensed at midpoint node 35 The monitor circuit 52, being connected to the midpoint 35 of the divider 26 is responsive to supply voltage changes which depart from that which exists at the common connected node 16. Aside from the different trigger point, the voltage monitor 52 functions in all other respects substantially identical to that of voltage monitor 24 The first output 50 can thus be used as an early warning output to signal an initial difference in the absolute magnitudes of the supply voltages $V_{dd}$ and $V_{ss}$. As such difference increases, and preferable to a level where the operation of the circuit 18 becomes unreliable, the other voltage monitor 52 will provide a second output 64 to shut down the powered circuit 18.

As noted above, monitor 24 is operative to provide an early indication of when the supply voltage $V_{dd}$ falls below that of supply $V_{ss}$, in terms of absolute magnitudes, while monitor 52 provides an indication of asymmetric power supply to the extent that reliable operation of the circuit 18 is in question The flexibility of the mointor of the invention can be appreciated when it is understood that to monitor the supply voltage $V_{ss}$ with respect to $V_{dd}$, the sensor transistor 40 need simply be connected to a sensing node closer to the $V_{dd}$ end of the divider 26. In this manner the sensor transistor 40 will trip when the supply voltage $V_{ss}$ falls below the supply voltage $V_{dd}$ by a prescribed amount, as determined by the particular divider node to which the sensor transistor 40 is connected.

In addition, the dual voltage monitor circuit of FIG. 3 can be further modified so that one output 64 provides an indication when the supply voltage $V_{dd}$ falls below the absolute magnitude of the supply voltage $V_{ss}$, and another output 50 provides the converse, e.g., when the absolute value of the supply voltage $V_{ss}$ falls below that of the supply voltage $V_{dd}$. In doing so, and as noted, the sensing transistor 40 of voltage monitor 24 is merely required to be connected at a sensing node somewhat above the midpoint of the divider 26. When so connected, the output 50 does not yield an early warning, but rather will respond when the supply voltage $V_{ss}$ has fallen a predetermined amount below the supply voltage $V_{dd}$.

Figure 4:
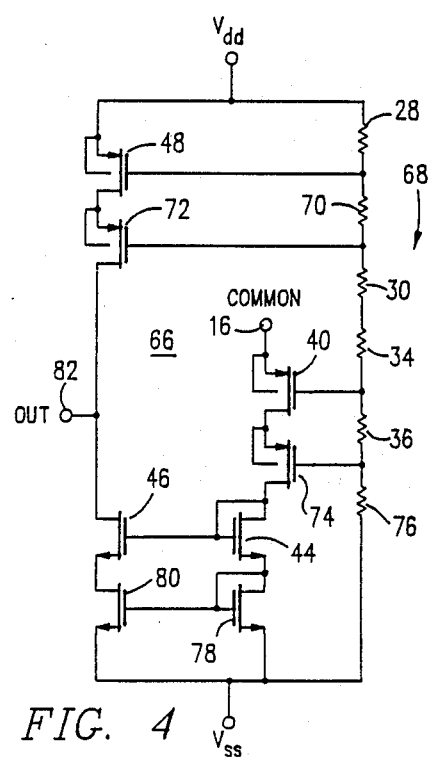
FIG. 4 is an electrical schematic drawing of the monitor circuit based upon that depicted in FIG. 2, but having cascoded transistor pairs.

With reference now to FIG. 4, there is illustrated another embodiment of the invention, similar to that of FIG. 2, but having cascoded transistor pairs. The voltage monitor 66 according to this embodiment includes a voltage divider 68 with additional resistances for properly biasing the transistors of the cascoded circuit. Particularly, voltage divider resistor 70 has been added for properly biasing a P-channel reference transistor 72 cascoded with reference transistor 48. P-channel transistor 74 is added as a sensing transistor cascoded with sensor transistor 40. Voltage divider resistor 76 provides proper biasing to the sensing transistors 40 and 74. Lastly, transistors 78 and 80 are additional transistors connected to perform a current mirror function, and connected in a cascoded manner with respect to mirror transistors 44 and 46. An output 82 of the voltage monitor 66 is provided at the junction of reference transistor 72 and current mirror transistor 46.

Figure 5:
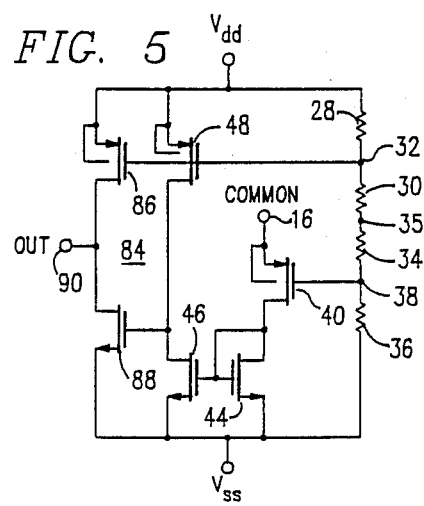
FIG. 5 is an electrical schematic drawing of the monitor circuit of the invention employing an inverter output.

By cascoding the various devices of the voltage monitor 66, the output impedance thereof is increased and the gain of the monitor circuit 66 is correspondingly increased. With increased gain, the resolution of the monitor is improved, in that the monitor is sensitive to small voltage changes in the divider, in response to supply voltage changes, for driving the output 82 to a different state. Another advantage of the cascoded devices is that any adverse affects or differences in the drain-source characteristics of the mirror transistors pairs are minimized By cascoding the mirror transistor pairs, the drain-source voltage characteristics will be substantially identical, thereby providing more reliable and predictable circuit operation. The voltage monitor 66 of FIG. 4 thereby affords a technique for more precisely determining when one of the voltage supplies is asymmetric with respect to the other voltage supply Yet another embodiment of the invention is depicted in FIG. 5. Here, an output precision inverter, comprising transistors 86 and 88, has been added to the voltage monitor previously depicted in FIG. 2. The precision inverter is an enhancement over conventional inverters in that reference transistors 48 and 86 are constructed with matched characteristics, and transistors 46 and 88 are constructed with matched characteristics. Moreover, such transistor pairs can be constructed as cross coupled pairs to avoid geometry effects. The cross coupling feature will be described in more detail below. By employing an output precision inverter, there is very little shift in the input offset voltage of the circuit The operating characteristics of the monitor 84 are thereby made more independent, and thus more predictable, as a result of variations in the integrated circuit fabrication processes of the voltage monitor.

Referring now to FIG. 6, there is shown a layout of the supply voltage monitor according to the preferred embodiment of the invention. Particularly illustrated is a voltage divider 92 providing a large number of tapped nodes, such as illustrated by reference character 94. The voltage tap 94 is shown enlarged in FIG. 7. The voltage divider 92 comprises a polysilicon strip 96 doped to exhibit a desired resistivity. Many resistivities can be used to suit particular purposes In the preferred form of the invention, the total resistance of the polysilicon strip 96 allows only several microamps of current to flow from the positive voltage supply $V_{dd}$ to the negative voltage supply $V_{ss}$. Power consumption of the monitor is thereby minimized. Conventional silicon semiconductor processes can be employed to fabricate the polysilicon strip 96 During fabrication of the polysilicon strip 96, a short lateral extension 98 of the doped polysilicon material is formed to provide external connections thereto By conventional masking techniques, an area 100 of low resistivity is formed in a electrical contact with the polysilicon lateral extension 98. Next, the wafer is covered with a metallization layer, masked and patterned to form a metal contact area 102 to which external connections can be made. Reference character 104 defines the contact opening to the metal pad 102. The formation of the low resistance area 100 on the metallization 102 is accomplished by the same process steps utilized in forming the other components of the integrated circuit The interconnection of desired contact pads to the voltage monitor circuit 106 is accomplished after the general fabrication of the integrated circuit In a conventional manner, internal connections 108 and 110 are made to the ends of the polysilicon strip 96 for connecting the supply voltages $V_{dd}$ and $V_{ss}$ thereto. As can be appreciated from the resistor divider 92, many voltage taps are provided and thus a very fine definition of monitor trip points can be obtained Precision biasing of the transistors of the monitor can also be achieved by connection thereof to the appropriate voltage divider tap points.

With reference now to FIG. 6 in conjunction with FIG. 8, there is depicted a dual voltage monitor 106 comprising a first monitor section 112 and a second monitor section 114. Voltage monitor section 112 is adapted for providing an output indicating when the supply voltage $V_{ss}$ operates asymmetrically with respect to that of the supply voltage $V_{dd}$. The second voltage monitor 114 is adapted for providing an output indicating when the supply voltage $V_{dd}$ does not track. Voltage monitor section 112 includes a sensing transistor 116 having gate-source connections connected respectively to the voltage divider 92 and the common connection 117 of the supply voltages $V_{dd}$ and $V_{ss}$. The sensing transistor 116 drives a current mirror 118 defined by matched transistors 120 and 122. Each mirror transistor 120 and 122 essentially comprises a pair of transistors, cross-coupled to enhance a predefined trip level of the sensing transistor 116. The cross-coupled transistors are illustrated as reference characters 124 and 126. The manner in which transistor pairs of the invention are cross-coupled is described below The current mirror 118 is connected to an inverter-type output 126. The inverter output transistor section 126 provides an output 128 of the voltage monitor 112. The inverter-type output comprises reference transistors 130 and 132, with cross-coupled transistor pairs 134 and 136, forming the push-pull output 128 In the fabrication of the monitor of the invention, transistors 130 and 132 are substantially identical, as are the transistors of the other cross-coupled pairs, such as 134 and 136, 120 and 124, and 122 and 126.

Voltage monitor 114 is comparably constructed, but connected to a different point on the voltage divider 92 to provide an output 138 responsive to a different threshold resulting from the asymmetric operation of the supply voltages $V_{dd}$ and $V_{ss}$. The transistors of FIG. 8 are identified and are shown in layout form in FIG. 6.

While not shown in detail in FIG. 6, the transistors pairs forming the various current mirrors and output sections of the monitor 106 are arranged to minimize adverse electrical effects resulting from directional or proximity effects. The transistors are cross-coupled to reduce first order geometry effects.

FIG. 9 illustrates two transistor pairs symmetrically oriented and cross-coupled to minimize the noted geometry effects For example, a transistor performing a single function may indeed comprise a pair of transistors, such as transistor 158 and 160 of FIG. 9. Transistors 162 and 164 are also formed in parallel by cross-coupling to provide a composite matched transistor. The four transistors 158-164 are arranged diametrically in a paired manner, with the connecting elements cross-coupled at area 166. A gate conductor 168 extends from transistor 158 to transistor 160 by a diagonal connection therebetween.

In like manner, gate conductor 170 is common to transistors 162 and 164 with an oppositely oriented diagonal gate connection. In practice, the gate conductors 168 and 170 need not be crossed one on top of the other, but can be routed in a manner to accommodate the use of a single metalization layer. The source-drain diffusions 172 and 174, associated with transistors 158 and 160, are similarly oriented on the semiconductor water, as are source and drain diffusions 176 and 178 of transistors 162 and 164. The cross-coupled nature of the transistors is effective to reduce electrical anomalies caused by orientation and geometrical placement of the circuit elements. In addition, by cross-coupling transistor pairs, the various gate-drain, gate-source and drain-source voltage parameters are better matched and more predictable Cross-coupling also makes the electrical characteristics of the transistors formed by the pairs more independent of processing differences between batches of semiconductor chips. As a result, the trip point of the voltage monitor is made consistent from chip to chip.

In practice, it has been found that supply voltage monitors constructed in accordance with the foregoing principles and concepts provide trip levels with high degree of resolution. For example, with proper selection of voltage divider resistors, and utilizing ±2 volt supplies, a 100 millivolt asymmetry is tolerated before an early warning output is provided Also, an output for shutdown purposes was provided when 200 millivolt asymmetry existed. Utilizing the same circuit with ±3 volts, the early warning and shutdown indications are generated with respective 200 millivolt and 300 millivolt supply voltage differences. Such results obtained are highly independent of temperature and processing considerations, and were found to be within about 15 millivolts of calculated levels In accordance with another feature of the invention, the voltage divider 92 provides the flexibility for enabling different connections to the monitor circuit, without the need of modifying the semiconductor fabrication processes. After fabrication of the monitor circuit 106 as well as the voltage divider 92, a final metallization step can be conducted to interconnect the monitor circuit 106 to the desired taps of the voltage divider 92. This is advantageous as the threshold or voltage trip level to which the monitor sensing transistors are sensitive can be adjusted to a high degree by connecting such transistor to the appropriate voltage divider taps. In the preferred form of the invention, eighty taps are provided, each of which can be connected to the monitor circuit 106. With this number of taps, and using ±2 volt voltage sources, 50 millivolt divider increments are provided The divider increments are independent of the resistivity of the polysilicon strip 96, and thus such strip can be made with a total resistance to minimize current flow, and thus reduce the power requirements for the overall monitor circuit 106. As can noted from FIG. 6, in order to provide an increased density, and thus number of voltage taps 94 on the divider 92, a plurality of such taps are located on each side of the polysilicon strip 96. Of course, the number of tapped positions on the voltage divider 92 is entirely arbitrary, and thus can be adjusted according to particular needs. For applications requiring few or no adjustments, only very few voltage taps may be needed, or indeed individual resistive elements may be utilized, each element having a predefined resistance.

The flexibility in interconnecting the circuits of the voltage monitor 106 to the divider 92 allows the performance characteristics of the voltage monitor to be modified. Thus, in certain situations where a user desires the threshold to which the circuit is responsive to be modified, a single mask need be changed to provide a different interconnection to the voltage divider 92. With this technique, the entire integrated circuit can be fabricated for universal use, and then as the last step thereof, such circuit can be interconnected to provide the individual needs of different users. After the final interconnection of the circuits of the voltage monitor 106 to the divider 92, the integrated circuit is completed by encapsulation and is then ready for use.

From the foregoing, disclosed is a highly flexibility voltage monitor which reduces or substantially eliminates the shortcomings of prior art circuits and devices. The voltage monitor of the invention comprises a small area circuit connected directly across the voltages to be monitored, and provides a wide variety of functions, depending upon an interconnection thereof to the voltage divider. For example, by connecting an input of a sensor transistor on one side of a midpoint of the divider, the monitor functions to detect when one of the voltages decays faster than the other monitored voltage On the other hand, when such transistor is connected on the other side of the divider midpoint, asymmetric operation of the other monitored voltage can be detected. In addition, the threshold for detecting asymmetric operation of the voltages can be selected by connecting the sensor transistor to one of numerous taps of the voltage divider. Moreover, the asymmetric operation of both monitored voltages can be accomplished by connecting a pair of similar monitor circuits to the same voltage divider, albeit connected to different taps thereof.

Various enhancements of the voltage monitor can be accomplished by utilizing cascoding of the transistors, providing inverter output configurations, and orienting and cross-coupling the devices on the wafer in predefined orientations. A highly sensitive and accurate voltage monitor is thereby achieved The flexibility and high precision nature of the voltage monitor of the invention is underscored by its simplicity of design, construction and ease with which it can be fabricated.

While the preferred embodiment of the invention has been disclosed with reference to specific voltage monitor apparatus and methods, it is to be understood that many changes in detail may be made as a matter of engineering choices without departing from the spirit and scope of the invention, as defined by the appended claims Moreover, many of the individual features of the invention may be utilized without incorporating all of the noted features thereof into a single voltage monitor.

What is claimed is:

1. A monitor circuit for use with dual voltage sources for providing an indication of an imbalance therebetween, comprising:
    a common connection for electrically connecting the voltage sources together;
    a voltage divider connected between the voltage sources, said voltage divider having an output which changes with respect to said common connection when the voltage of the sources changes asymmetrically;
    a sensor transistor connected to said common connection and to said voltage divider output for generating an output current in response to a voltage difference between said common connection and said output of said voltage divider;
    a further transistor responsive to current flow through said divider for producing a further output current; and
    an output circuit for subtracting said output current of said sensor transistor from said output current of said further transistor to provide a monitor output logic signal indicative of said imbalance.

2. The monitor circuit of claim 1 wherein said common connection comprises a circuit ground having substantially a zero potential.

3. The monitor circuit of claim 1 wherein said sensor transistor has a conduction path with a first end thereof connected to said common connection and has a control electrode connected to said voltage divider output.

4. The monitor circuit of claim 3 wherein said output circuit includes a current mirror circuit having an input coupled to receive the output current of said sensor transistor and having an output coupled to receive said output current of said further transistor and providing said monitor output logic signal.

5. The monitor circuit of claim 4 wherein said output circuit comprises a push-pull circuit including said further transistor and an output transistor of said current mirror, said push-pull circuit developing an output voltage swing for said monitor output signal that is substantially equal to the voltage across said voltage divider.

6. The monitor circuit of claim 1 wherein said voltage divider includes a plurality of connection points to which said sensor can be connected to make said monitor responsive to different asymmetric voltage changes of said sources.

7. The monitor circuit of claim 6 wherein said voltage divider comprises a resistive polysilicon strip.

8. The monitor circuit of claim 6 wherein said polysilicon strip further includes a plurality of taps defining said connection points, each tap being characterized by a different voltage.

9. The monitor circuit of claim 4 wherein said polysilicon strip further includes a plurality of taps defining said connection points, each tap being characterized by a different voltage.

10. A monitor circuit for use with a dual voltage source for providing an indication of an imbalance therebetween, comprising:
- a resistive strip connected between said sources for defining a continuum of different voltages along said strip;
- a plurality of taps connected to said strip;
- a sensor transistor with a first electrode connected to a common connection said voltage sources and having a second electrode connected to one of said voltage taps; a first transistor and a second transistor defining a current mirror connected to said sensor transistor, one transistor of said mirror being connected to an output of said monitor and to one of said voltage sources; and
- an output transistor connected to said monitor output and to the other of said voltage sources, said output transistor being connected to one of said taps for biasing said output transistor.

11. The monitor circuit of claim 10 wherein at least one of said transistors of said monitor circuit is connected in cascade with a further transistor.

12. The monitor circuit of claim 10 further including a pair of output transistors connected to define an inverter output.

13. The monitor circuit of claim 10 further including a pair of cross-coupled transistors defining ones of said transistors to reduce the differences in electrical characteristics of the connected transistors.

14. The monitor circuit of claim 10 wherein each transistor defining said current mirror comprises a pair of cross-coupled parallel transistors, and said output transistor comprises a pair of transistors connected together to define an inverter output.

15. A monitor circuit for use with dual voltage sources for providing an indication of an imbalance therebetween, comprising:
- a voltage divider connected between the voltage sources, said voltage divider having at least first, second and third taps each providing a different output voltage of said divider;
- a current source coupled to said first tap for providing a reference output current representative of voltage across said divider;
- a sensor responsive to a voltage difference between a common connection of the voltage sources and said voltage divider for providing a sensor output current;
- means for selectively connecting said sensor to said second tap for making said monitor circuit responsive to an asymmetrical imbalance of one of said voltage sources with respect to the other of said voltage sources, and for selectively connecting said sensor to said third tap for making said monitor responsive to an asymmetrical imbalance of said other voltage source with respect to said one voltage source; and
- an output circuit for subtracting said sensor output current from said reference output current for providing a digital representation of said imbalance.

16. The monitor circuit of claim 15 wherein said voltage divider comprises a polysilicon strip having at least three metal connection taps corresponding to said first, second and third taps of said voltage divider.

17. The monitor circuit of claim 15 wherein said sensor is connected to solely one of said second and third taps and the other of said second and third taps is unused to thereby define the operation of said monitor circuit, and said circuit is encapsulated.

18. The monitor circuit of claim 15 wherein said sensor is connected to both of said second and third taps for producing dual sensor output currents each of which is subtractively combined with said reference current to provide a dual monitor for indicating the asymmetrical operation of each said voltage source.

19. The monitor circuit of claim 15 wherein said sensor is connected to a midpoint of said divider for sensing the asymmetrical operation of said voltage sources about a voltage defined by said common connection.

20. A method of sensing the asymmetrical imbalance of a pair of voltages to be monitored comprising the steps of:
- providing a continuum of voltages with magnitudes between the magnitudes of the monitored voltages, such that when one of the monitored voltages changes, said continuum of voltages changes;
- generating a first output current in proportion to said continuum of voltages;
- sensing a voltage change between a selected one of said continuum of voltages and a voltage defined by a common connection between said voltage sources;
- generating a second output current in response to said sensed voltage change; and
- subtracting said second current from said first current for generating a digital output representation of the asymmetric operation of said monitored voltages.

21. The method of claim 20 further including grounding said common connection to provide a reference zero potential.

22. The method of claim 20 wherein the step of subtracting said second current from said first current comprises mirroring said second current to produce a third current and applying said first and third currents to an output node to provide a sensitive trigger point of said digital output.

23. The method of claim 20 further including sensing said voltage change with a high degree of precision by cross-coupling a first and second pair of transistors to thereby define a current mirror connected to a sensing transistor.

24. The method of claim 20 further including forming a sensing circuit to perform said sensing by orienting a number of transistors defining said circuit to reduce geometry effects of said circuit.

25. The method of claim 20 further including providing said continuum of voltages by attaching a plurality of electrical connections to a polysilicon resistive strip.

26. The method of claim 25 further including forming said resistive strip with about eighty different voltages.

27. The method of claim 20 further including:
- generating a third output current in proportion to said continuum of voltages;
- sensing a voltage change between a further one of said continuum voltage and said common connection;
- generating a fourth output current in response to said voltage change of said further one of said voltages;
- subtracting said fourth output current from said third output current; and wherein
- said first named step of subtracting said second current from said first current providing an indication of asymmetric operation between one monitored voltage and the other and said second named step of subtracting said fourth current from said third current providing an indication of asymmetric operation between said other monitored voltage and said one monitored voltage.

28. The method of claim 20 further including sensing a voltage change at a midpoint of said continuum to sense asymmetric operation of voltages about said common connection.

29. A method of fabricating a universal voltage monitor circuit for monitoring the relative magnitudes of first and second input voltages, comprising the steps of:
forming a divider having end points for receiving respective ones of said input voltages and having at least first, second and third taps providing respective tap voltages;
forming a current source responsive to a voltage produced at said first tap for providing a reference current;
forming a voltage sensor circuit responsive to a voltage difference between a predefined stable voltage and one of said first and second tap voltages so as to provide an output current indicative of asymmetrical operation of the voltages connected between said end points of the divider;
forming a combining circuit for subtracting said output current of said voltage sensor from said reference current; and
providing the option of connecting a given input node of the sensor circuit to one of said second and third taps of said divider to detect asymmetric operation of the one monitored voltage with respect to the other monitored voltage, and the option of connecting said given input node of the sensor circuit to another one of said second and third taps of said divider to detect the asymmetric operation of the other said monitored voltage with respect to the said one monitored voltage.

30. The method of claim 29 further including connecting the voltage monitor circuit to the desired divider voltage after fabrication of the circuit.

31. The method of claim 30 further including encapsulating said universal voltage monitor after connecting said voltage monitor circuit to said divider voltage.

32. The method of claim 20 further including connecting said voltage monitor to a divider voltage by a metalization and patterning process after metalization of said voltage monitor circuit.

33. The method of claim 29 further including providing about eighty different divided voltages 34. A method of sensing an asymmetrical operation of a pair of voltages, comprising the steps of:
connecting the pair of voltages across a divider having a plurality of tap positions each providing a voltage which changes when at least one voltage of said pair of voltages changes in magnitude;
converting a voltage of one of said tap positions to a reference output current which changes in response to a change in one voltage of said pair of voltages, said reference current providing an output indication of current flow through said divider;
sensing a predetermined voltage difference between said common voltage and a voltage of another of said tap positions to provide a trip indication of asymmetrical operation of said pair of voltages; and
converting said trip indication into an output current which is subtractive from said reference current to thereby provide an output indication of asymmetric operation of said pair of voltages.

35. The method of claim 34 further including driving said reference current and said output current into a high impedance to thereby convert both said currents into an output voltage.

36. The method of claim 34 wherein said converting step includes mirroring said output current to provide a mirrored current, and applying said reference current and said mirrored current to a circuit node for developing said output indication.

37. The method of claim 34 further including referencing said pair of voltages by connecting a positive terminal of a first supply voltage to a negative terminal of a second supply voltage.

38. A voltage monitor circuit, comprising:
a voltage divider to which first and second input voltages to be monitored are applied;
a first sensor coupled to a first fixed tap on said divider for providing an output current representative of current flow through said divider;
a second sensor coupled to a second fixed tap on said divider for providing an output representative of the relative magnitude of said input voltages; and
an output circuit coupled to said sensors for subtracting said output current of said second sensor from said output current of said first sensor to provide an output logic signal having a first level when the magnitude of said first input voltage exceeds that of said second input voltage by a threshold value and having a second level otherwise.

39. A voltage monitor circuit, comprising:
a potential divider having a pair of taps;
first and second transistors, each having a control electrode coupled to a respective one of said pair of taps, said first transistor providing an output current proportional to a current flow through said divider, said second transistor providing an output current indicative of the relative magnitudes of first and second potentials applied to end points of said divider; and
a current mirror having an input terminal connected to receive said output current of said second transistor and having an output terminal connected to receive said output current of said first transistor, said output terminal providing a logic signal indicative of said relative magnitudes of said potentials.

* * * * *